United States Patent [19]

Rothman et al.

[11] Patent Number: 5,355,386
[45] Date of Patent: Oct. 11, 1994

[54] MONOLITHICALLY INTEGRATED SEMICONDUCTOR STRUCTURE AND METHOD OF FABRICATING SUCH STRUCTURE

[75] Inventors: Mark A. Rothman, Acton, Mass.; Chan-Long Shieh, Paradise Valley, Ariz.; Craig A. Armiento, Acton, Mass.; John A. Thompson, Bedford, Mass.; Alfred J. Negri, Waltham, Mass.

[73] Assignee: GTE Laboratories Incorporated, Waltham, Mass.

[21] Appl. No.: 977,596

[22] Filed: Nov. 17, 1992

[51] Int. Cl.$^5$ .......................... G02B 6/30; H01S 3/25
[52] U.S. Cl. ........................ 372/50; 257/84; 385/49; 385/52
[58] Field of Search ............ 385/14, 48, 49, 50, 385/52, 88, 89; 372/49, 50; 257/84, 85

[56] References Cited

U.S. PATENT DOCUMENTS

| | | | |
|---|---|---|---|
| 4,079,404 | 3/1978 | Comerford et al. | 385/14 X |
| 4,466,696 | 8/1984 | Carney | 385/49 |
| 4,470,143 | 9/1984 | Kitamura et al. | 372/50 |
| 4,794,609 | 12/1988 | Hara et al. | 372/50 |
| 4,892,374 | 1/1990 | Ackerman et al. | 385/49 |
| 4,904,036 | 2/1990 | Blonder | 385/14 |
| 4,989,935 | 2/1991 | Stein | 385/49 X |
| 5,069,561 | 12/1991 | Rideout et al. | 385/14 |
| 5,077,878 | 1/1992 | Armiento et al. | 29/25.02 |
| 5,103,455 | 4/1992 | Eichlen et al. | 372/50 |
| 5,163,108 | 11/1992 | Armiento et al. | 385/89 |
| 5,259,049 | 11/1993 | Bona et al. | 385/50 |

OTHER PUBLICATIONS

Balliet et al., "Self-Aligning Edge Emitter for Fiber Optics," *IBM Tech. Discl. Bull.*, vol 23, No. 7B, Dec. 1980, pp. 3104–3106.

M. S. Cohen, M. F. Cina, E. Bassous, M. M. Oprysko and J. L. Speidell, "Passive Laser-Fiber Alignment by Index Method," IEEE Trans. Phot. Tech. Letters, 3, pp. 985–987 (Nov. 1991).

M. A. Rothman, J. A. Thompson and C. A. Armiento, "Multichamber RIE Processing for InGaAsP Ridge Waveguide Laser Arrays, " Mat. Res. Soc. Symp. Proc. 240, pp. 341–348 (1992) (no month).

Antreasyan et al., "Stop-cleaved InGaAsP Laser Monolithically Integrated with a Monitoring Detector," Appl. Phys. Lett. 47(9), pp. 920–922 (Nov. 1, 1985).

Brady et al., "Self-Aligned Optical Fiber/Laser Structure" IBM Tech. Disclosure Bulletin., vol. 26, No. 11, pp. 5993–5995 (Apr. 1984).

*Primary Examiner*—John D. Lee
*Attorney, Agent, or Firm*—Victor F. Lohmann, III

[57] ABSTRACT

A heterostructure device includes a ridge-waveguide laser monolithically integrated with a ridge-waveguide rear facet monitor (RFM). An integral V-groove etched directly into the device substrate enables passive alignment of an optical fiber to the active region of the laser. The laser and RFM facets were formed using an in-situ multistep reactive ion etch process.

9 Claims, 10 Drawing Sheets

MONOLITHICALLY INTEGRATED SEMICONDUCTOR STRUCTURE AND METHOD OF FABRICATING SUCH STRUCTURE

FIELD OF THE INVENTION

The present invention relates to semiconductor structures and, more particularly, to a monolithically integrated laser, detector, and fiber-receiving channel.

BACKGROUND OF THE INVENTION

Development of monolithically integrated photonic circuits will enhance the functionality, reliability, and cost effectiveness of optical subsystems. However, the packaging of both discrete devices and optoelectronic integrated circuits (OEICs) often requires active alignment of optical fiber pigtails that substantially increases the cost of such components. Techniques for cost-effective fiber coupling of lasers, using passive rather than active alignment, have been demonstrated using separate silicon substrates that incorporated V-grooves for fiber placement.

In particular, mechanical features such as fiducials are etched into a silicon substrate platform, and serve as reference pedestals for positioning a chip which abuts against the pedestals.

Examples of prior art alignment techniques may be found in Armiento et al "Passive Coupling of InGaAsP/InP Laser Array and Single-Mode Fibers using Silicon Waferboard," Electronic Letters, pp. 1109–1110 (1991), Cohen et al., "Passive Laser-Fiber Alignment. by Index Method," IEEE Trans. Phot. Tech Letters Vol 3 pp 985–987 (1991) and U.S. Pat. No. 5,077,878.

OBJECTS OF THE INVENTION

It is a principal object of the present invention to obviate the above-noted and other disadvantages of the prior art.

It is a further object of the present invention to provide a structure permitting the passive alignment of a laser with a detection region and an optical fiber without requiring the etching of alignment structures in the substrate or laser array.

It is a further object of the present invention to provide a method of fabricating a monolithically integrated laser/rear facet monitor/V-groove device using an in-situ multistep reactive ion etch process.

SUMMARY OF THE INVENTION

In one aspect of the present invention, a semiconductor structure comprises a fiber-receiving channel, an optical detection region, and a lasing region interposed between and in monolithic serial integration with said fiber-receiving channel and said optical detection region.

In another aspect of the present invention, a method of fabricating a device structure from a starting wafer having a heterostructure material grown on a substrate, comprising the steps of: masking the wafer with a first mask pattern having exposure windows corresponding to device regions of said wafer; controllably etching through the exposed device regions of said wafer, patterned by the first mask pattern, to define a ridge waveguide area and a fiber-receiving area; masking the wafer with a second mask pattern having exposure windows corresponding to areas for forming facet surfaces in said ridge waveguide area; controllably etching through the exposed regions of said wafer, patterned by the second mask pattern, to define a lasing region and a detection region; masking the wafer with a third mask pattern having an exposure window corresponding to said fiber-receiving area; and controllably etching through the exposed regions of said wafer, patterned by the third mask pattern, to define a fiber-receiving channel in said wafer.

BRIEF DESCRIPTION OF THE DRAWINGS

For a better understanding of the present invention, together with other objects, advantages and capabilities thereof, reference is made to the following Description and appended Claims, together with the Drawings, in which:

DETAILED DESCRIPTION OF THE PREFERRED EMBODIMENTS

As noted above, conventional approaches to integrating an optoelectronic component with an optical fiber have involved an active alignment procedure requiring the component to be powered while the fiber is actively manipulated into alignment. Recent work has avoided active alignment processes by using substrate platforms with alignment pedestals and standoffs or fiducials. Advantageously, the present invention detailed below incorporates the laser with an integral V-groove that enables passive fiber alignment without the need for a hybrid substrate such as silicon.

Figure 1:
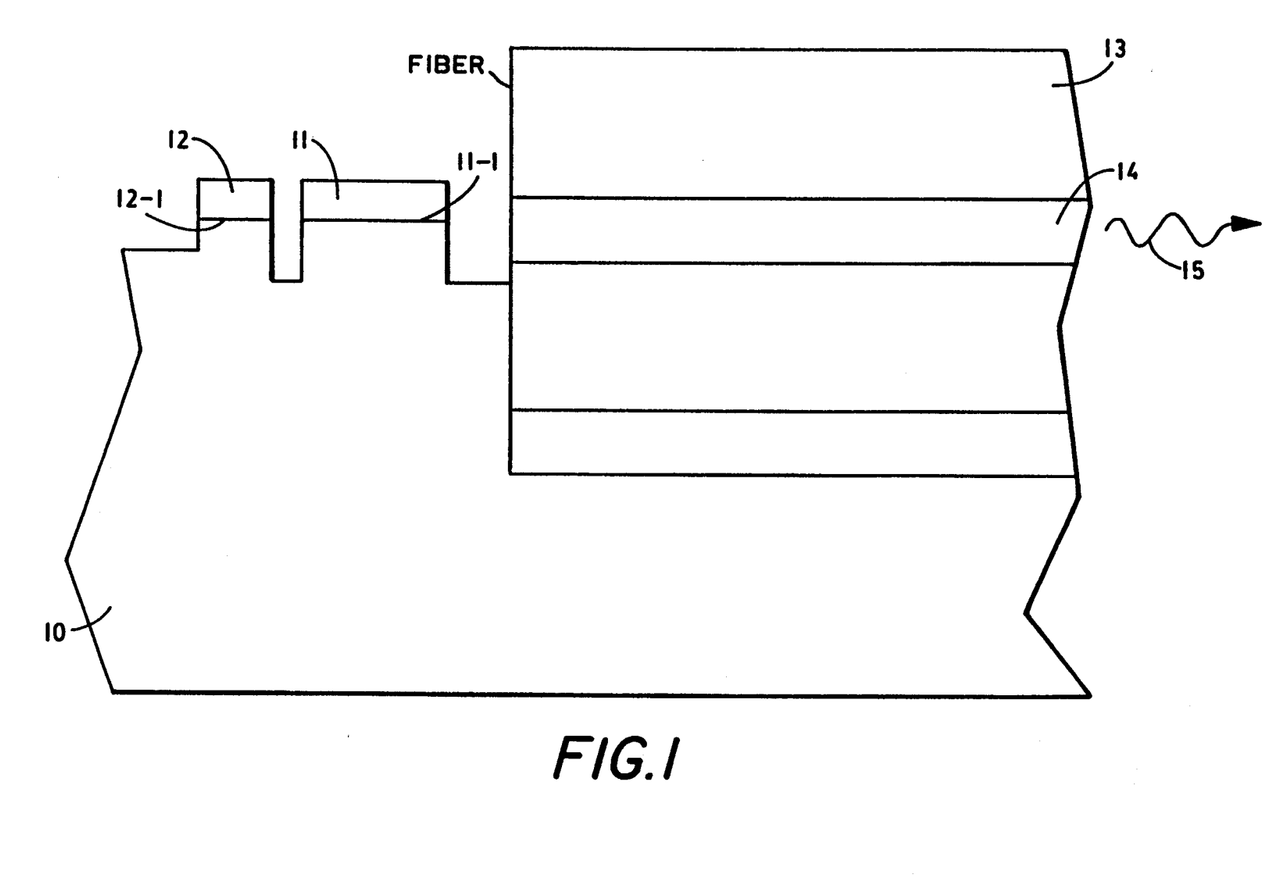
FIG. 1 is a cross-sectional view of an integrated device structure in accordance with the present invention.

The present invention shown illustratively in FIG. 1 concerns a device structure and fabrication method for monolithically integrating a laser, detector, and fiber-receiving channel. As indicated in the cross-sectional view, a lasing region 11 with active laser 11-1 is monolithically integrated with an adjacent detecting region 12 with active layer 12-1. Although not shown, a fiber-receiving channel is etchably formed in substrate 10 adjacent lasing region 11 for receiving a fiber 13 having core 14. When sufficient drive current is applied to the lasing region, light is transmitted from a front facet of laser 11 in a forward direction towards fiber 13, and is transmitted from a rear facet of laser 11 in a rearward direction towards detector 12.

Preferably, the detection region 12 is a rear facet monitor (RFM) photodetector serving to monitor the optical output of the lasing region 11 so that the laser drive current from a driver circuit (not shown) can be adjusted to maintain a desired output power in optical signal 15. As will be detailed below, regions 11 and 12 are fabricated from a common initial wafer structure; accordingly, the active layers 11-1 and 12-1 are in strict coaxial alignment. The processing of the fiber-receiving channel is appropriately controlled so that when fiber 13 is positioned in the channel, core 14 is in substantial coaxial alignment with the active layer 11-1.

Figure 2:
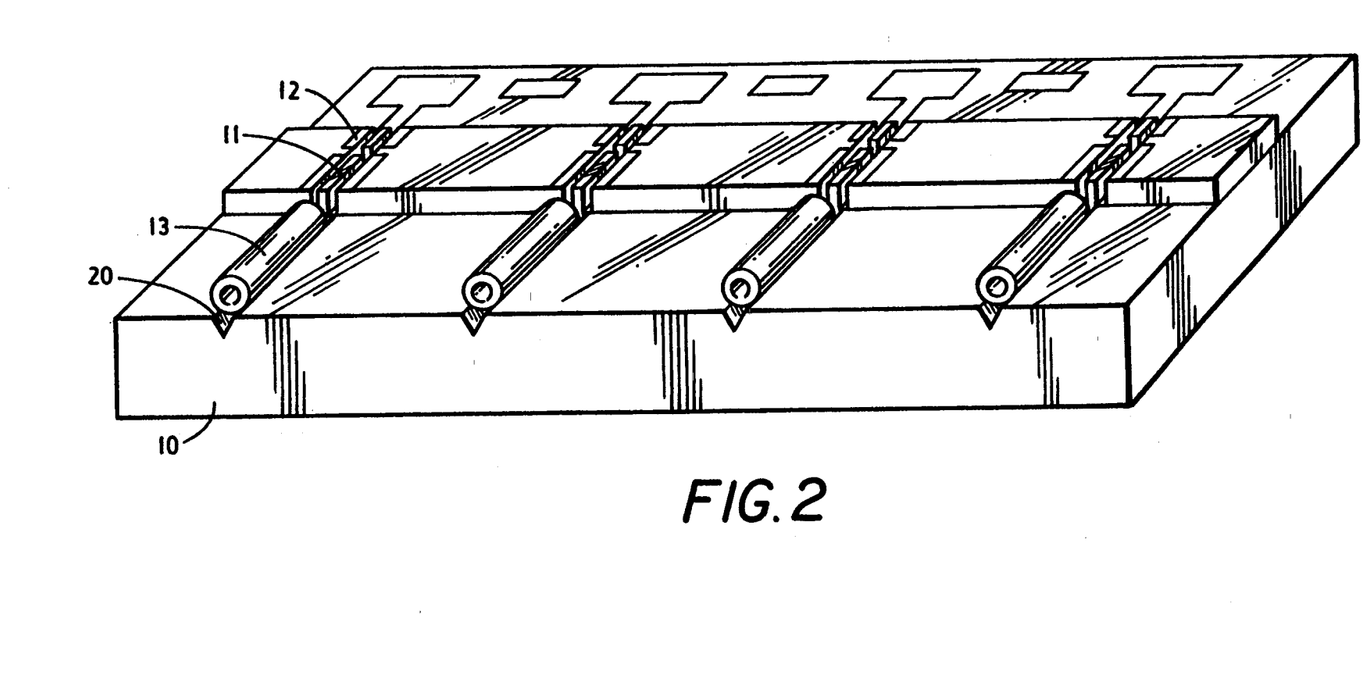
FIG. 2 illustrates an upper perspective view of a monolithic array including a plurality of the device structures in FIG. 1.

FIG. 2 shows a monolithically integrated array of four device structures each conforming to the device assembly in FIG. 1. For purposes of clarity and consistency, similar structures among the drawings are designated with like numerals. Each of the individual device structures includes a respective fiber-receiving channel 20 preferably etched in the shape of a V-groove for receiving a fiber 13.

The performance of the device structure according to the present invention was evaluated by obtaining a variety of measurements. The laser/RFM characteristics were measured on unpackaged devices while operating in a pulsed mode. Measurement of the relative light-current characteristics of the devices was performed in wafer form by probing the integrated photodetector.

Figure 3:
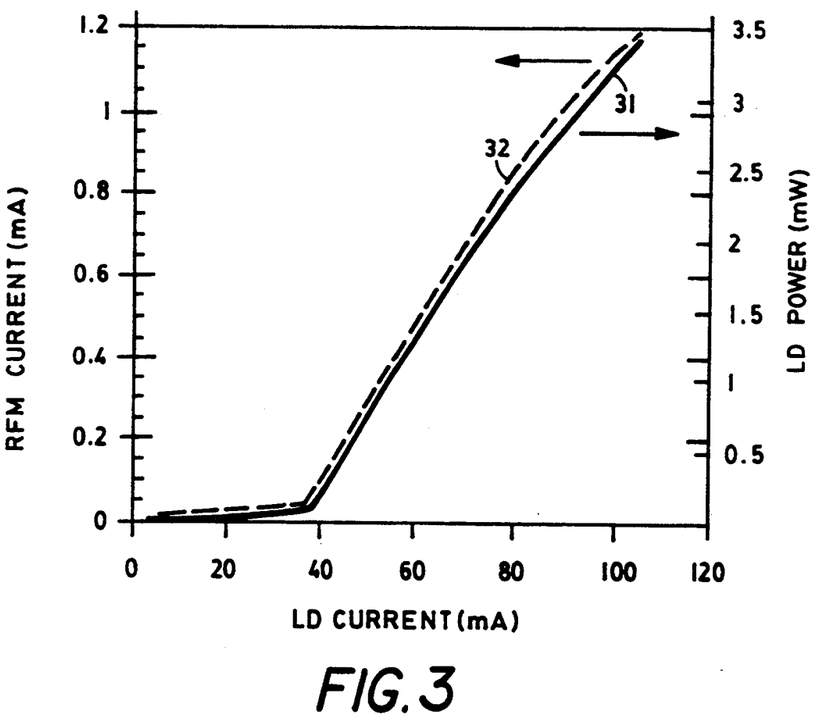
FIG. 3 shows the optical output power from a laser facet and the corresponding detected current level as a function of laser drive current for the FIG. 1 device structure.
Figure 4:
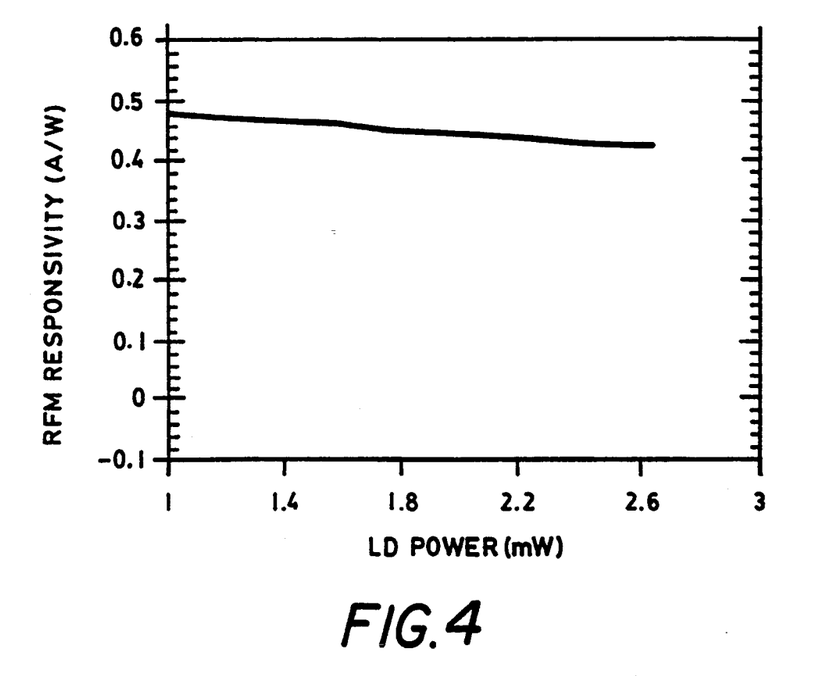
FIG. 4 shows the responsivity of a rear facet monitor in accordance with the present invention.
Figure 5:
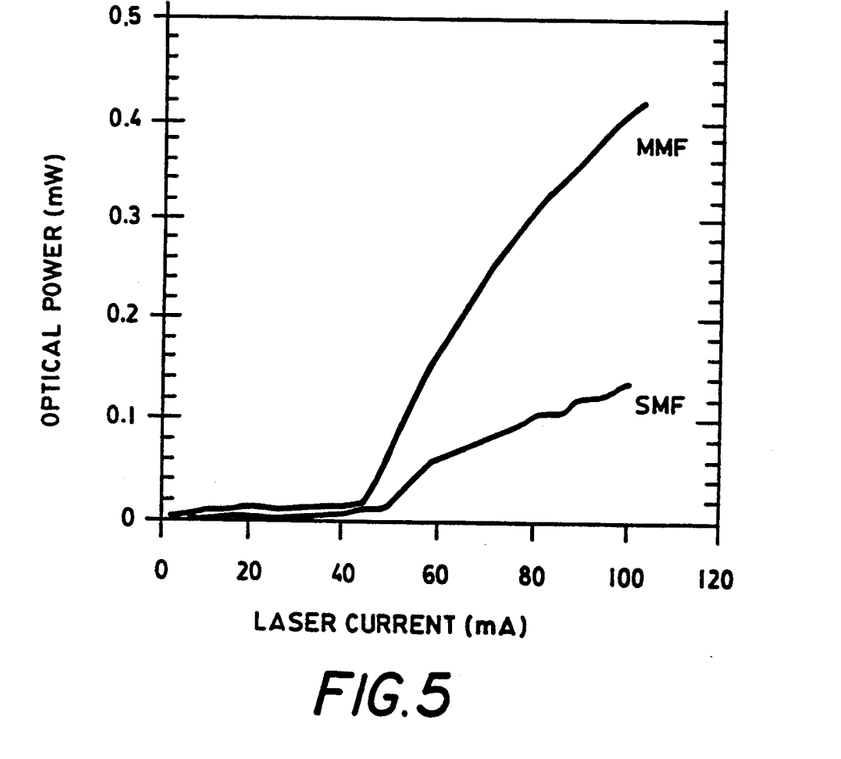
FIG. 5 plots the optical power introduced into a single-mode and multi-mode fiber integrated with the device structure in FIG. 1.

FIG. 3 shows the optical power from the front laser facet (curve 31) and the corresponding photocurrent detected by the RFM (curve 32) as a function of laser drive (LD) current. A device with the V-groove removed was used to make this measurement. The graph indicates a device with a laser threshold current of 40 mA and an RFM responsivity of 0.36 A/W. Measurements obtained over a variety of device structures revealed threshold currents as low as 38 mA and RFM responsivities as high as 0.49 A/W. FIG. 4 plots RFM responsivity versus laser optical power. The optical characteristics of an integrated laser/RFM structure passively coupled to optical fibers in accordance with the present invention is shown in FIG. 5. In particular, measurements of such optical characteristics were obtained by placing a single-mode fiber (SMF) or multi-mode fiber (MMF) in the V-groove. The measurements indicated coupling efficiencies as high as 8% and 18% for single-mode and multi-mode fibers, respectively.

FIGS. 6–10 represent successive intermediate views of a device structure undergoing processing to fabricate the monolithically integrated device structure of the present invention. Although the following discussion of the fabrication steps is directed to a specific material system and geometry in accordance with a preferred embodiment, this should not serve as a limitation of the present invention as it should be obvious to those skilled in the art that other material systems and dimensions are possible within the scope of the present invention.

Figure 6:
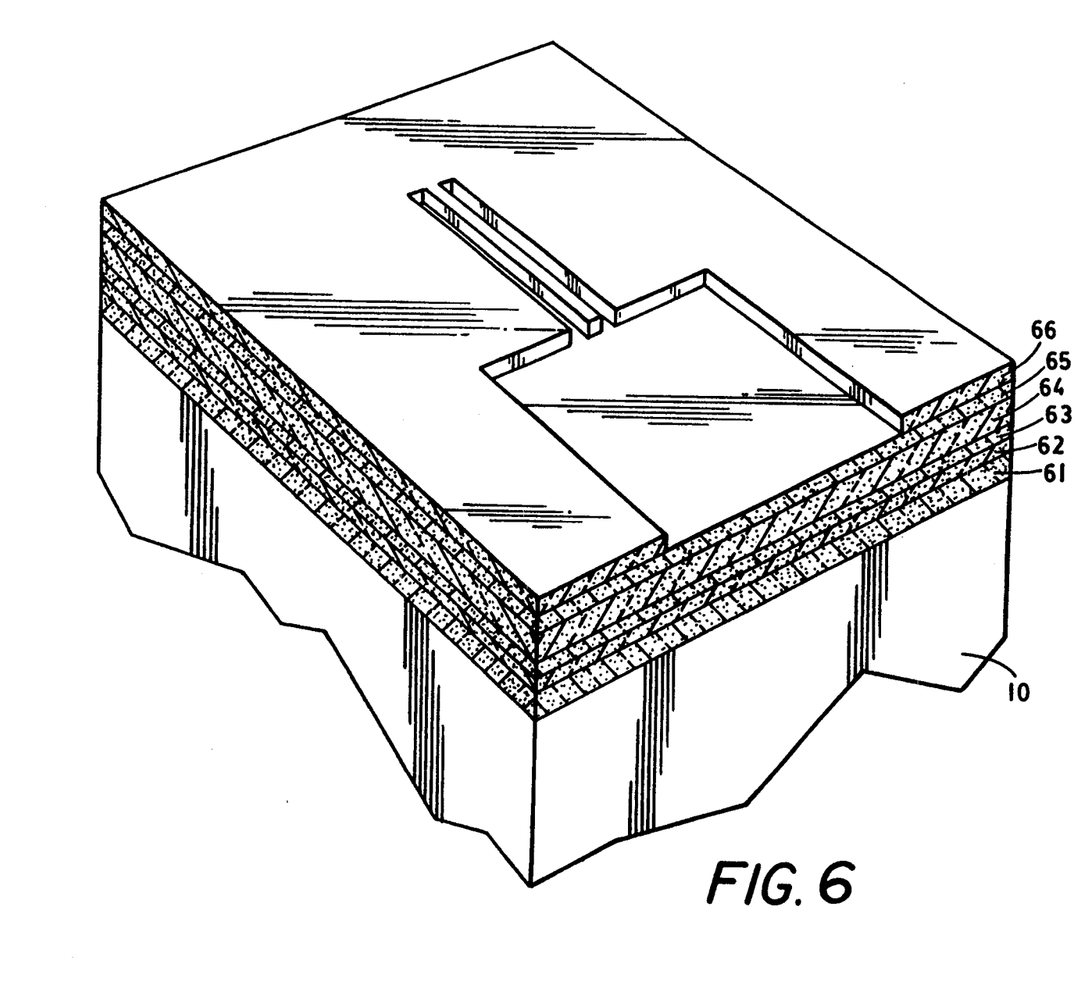
FIGS. 6, 7A, 7B, 8, 9A, 9B, 10A and 10B present perspective and cross-sectional views illustrating a sequence of process steps for fabricating an integrated device structure in accordance with a preferred embodiment of the present invention.

FIG. 6 shows a structure illustrating the first step of the fabrication sequence (discussed below). Prior to commencement of the fabrication process, however, a starting wafer structure was provided including substrate 10 and layers 61–65. In particular, a double heterostructure layer material was grown by metallorganic vapor phase epitaxy (MOVPE). The layers included a p-InGaAs ohmic contact layer 65 (Zn-doped $2 \times 10^{19}$ cm$^{-3}$), a p-InP upper cladding layer 64 (Zn-doped $1 \times 10^{18}$ cm$^{-3}$, an undoped InGaAsP etch stop layer 63 ($\lambda 1.0$ $\mu$m), an undoped InGaAsP active layer 62 (l=1.3 $\mu$m), and a 4.0 $\mu$m n-InP lower cladding layer 61 grown on a (100) n$^+$-InP substrate 10.

In general, many of the fabrication steps for the monolithically integrated laser/RFM/V-groove device utilize a reactive ion etching (RIE) process. The RIE process is performed in a computer-controlled reactive ion etch system equipped with four separate etch chambers, each with a different etch chemistry. The RIE system has a load lock chamber and a central transfer chamber with a robotic arm for wafer transfer between the four etch chambers. An illustrative discussion of an RIE system may be found in Rothman et al., "Multi-chamber RIE Processing for InGaAsP Ridge Waveguide Laser Arrays," Mat. Res. Soc. Symp. Proc., Vol 240, pp 341–348 (1992) herein incorporated by reference.

The fabrication sequence for the integrated device structure commences with the deposition of a layer of SiN$_x$ on the as-grown starting wafer using a Plasma Tech. PECVD machine. The process 1 step 3 timer of the PECVD machine is set to 16 minutes for depositing an SiN layer of 200 nm thickness. A buffered HF etch lasting 15 seconds precedes the SiN$_x$ deposition.

A first lithographic pattern is then developed having mask openings defining the ridge-waveguide and the area for the fiber-receiving channel. In particular, the ridge waveguide region corresponds to the laser and RFM structures, and the channel area refers to the V-groove region. The use of one mask level for the ridge and V-groove structures ensures precise alignment and spacing of the laser ridge and the V-groove. The pattern is developed with the following steps:

a) spin HMDS at 5 krpm for 60 s;
b) spin Shipley 2400 at 5 krpm for 60 s;
c) bake at 90° C. for 20 minutes;
d) align the proper orientation of the wafer to the mask via the cleaved edge;
e) expose mask with ST mode on Karl Suss 300 mask aligner for 13 s; and
f) develop mask in solution (1 part of Az 2401 to 4 parts of water) for 75 s.

The photoresist pattern is then transferred to the SiN$_x$ layer using an SF$_6$-based RIE process. In particular, the patterned SiN$_x$ layer is etched in an SF$_6$ plasma for 2 minutes, followed by an oxygen plasma etch for 10 minutes. The wafer structure after the patterned etch step is shown in the perspective view of FIG. 6, with SiN$_x$ layer 66 being etched in accordance with the photoresist pattern to expose selected regions of contact layer 65.

A reactive ion etching (RIE) step is then used to etch through the exposed regions of the contact layer 65 and the underlying cladding layer 64. Specifically, a dry etch using a CH$_4$/H$_2$/Ar plasma is executed for 30 minutes, the depth of the etch is measured, and the dry etching is continued until the etch depth is within 0.25 $\mu$m of the etch stop layer 63. Prior to the wet etch, the wafer is cleaned by being boiled sequentially in acetone and isopropyl alcohol (10 minutes each), and blown dry in N$_2$. The wet chemical etch uses an 8:1 H$_3$PO$_4$/HCl mixture, and lasts for 5 minutes. A perspective view of the wafer structure following the dry etch and wet chemical etch is shown in FIG. 7A.

Figure 7A:
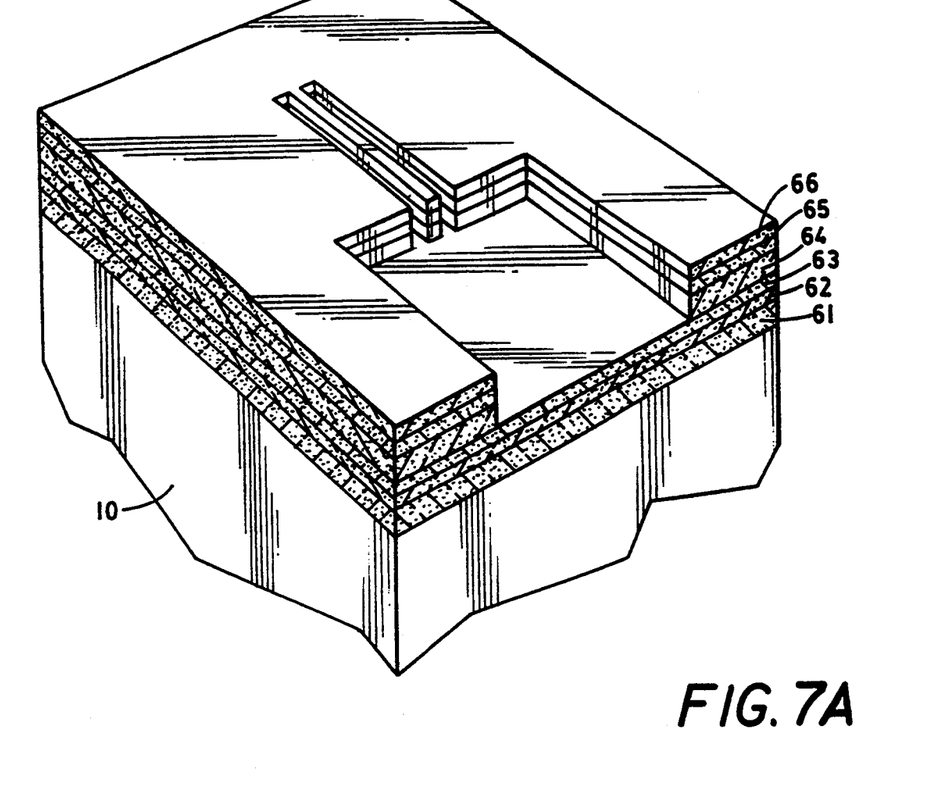
Figure 7B:
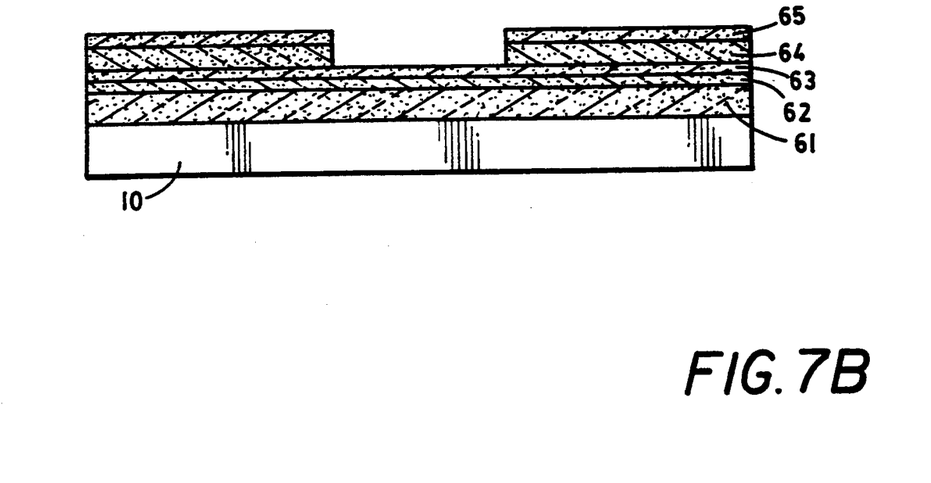
Figure 8:
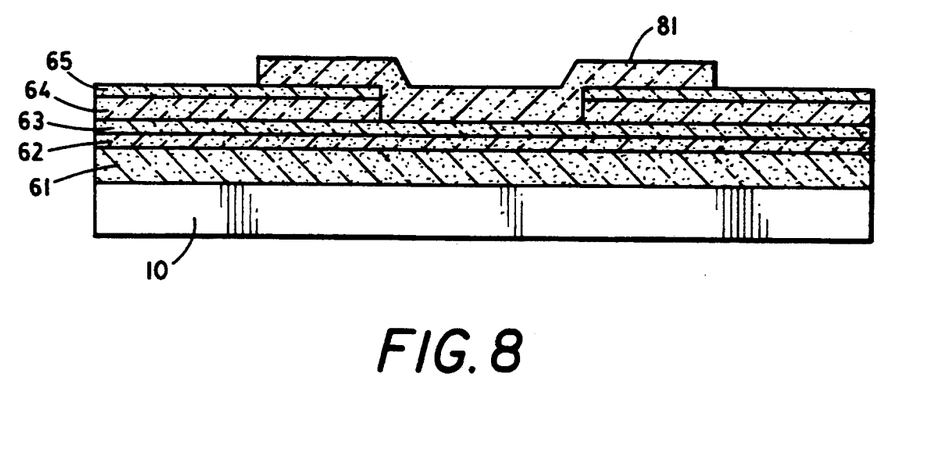

FIG. 7B shows a front cross-sectional view of the FIG. 7A structure after the remainder of the original SiN$_x$ layer 66 is removed in buffered HF. The wafer is then rinsed in DI water and blown dry in N$_2$.

A second SiN$_x$ layer is then deposited on the wafer of FIG. 7B to protect the wafer during a subsequent processing step (detailed below) which patterns p-ohmic metal (AuZn) and final metal (TiAu) on the ridge. For the SiN$_x$ deposition step, shown illustratively in the front cross-sectional view of FIG. 8, the Plasma Tech. PECVD Process 2 step 5 timer is set to 32 minutes and an $SiN_x$ layer 81 of 400 nm thickness is deposited. The metal patterning on the ridge structure of the RFM and laser regions is performed by the steps described below.

A second lithography pattern is formed to define exposure areas corresponding to the ridge structure of the wafer. The pattern is formed with the following steps:

(a) spin HMDS at 5 krpm for 60 s;
  (b) spin AZ 1450 at 5 krpm for 5 s and at 1 krpm for 25 s;
  (c) bake mask at 90° C. for 20 minutes;
  (d) align and expose mask with ST mode on Karl Suss 300 mask aligner for 25 s; and
  (e) develop mask in solution (1 part of AZ 351 to 5 parts of water) for 75 s.

The mask pattern is then transferred to the wafer and the exposed $SiN_x$ on the ridge structure is removed by etching the $SiN_x$ in an $SF_6$ plasma for 4 minutes. The exposed underlying contact layer is cleaned by etching in an 80:1:1 mixture of $H_2O/H_2O_2/H_2SO_4$ for 20 s, rinsed in DI water, and then blown dry in $N_2$. A 200 nm-thick layer 65 of Au:Zn is then deposited on the entire wafer, and lifted off in acetone by boiling and spraying, which leaves Au-Zn on the ridge structure only. The Au:Zn layer is alloyed by placing the wafer face-up in a Heat Pulse 210 assembly, manually raising the temperature to 400° C. by using 30% power level, and remaining at this temperature for 10 s before terminating power. The wafer is then cooled to 100° C. before being removed from the assembly.

Figure 9A:
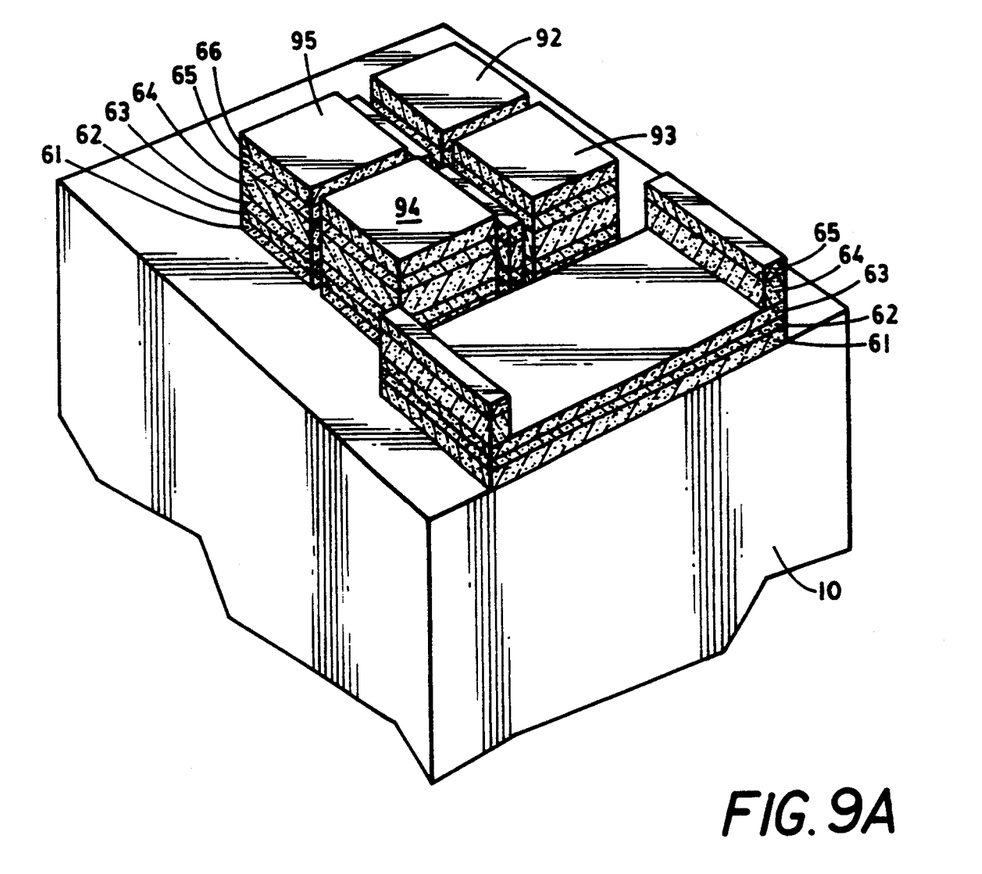

FIG. 9A is a perspective view of the structure resulting from the processing steps (detailed below) for depositing the final metal on the wafer, and for forming the vertical facet surfaces in the ridge waveguide area to define the individual RFM and laser structures. The fact surfaces, in particular, are produced by a reactive ion etching step.

For depositing the final metal on the wafer, a third lithographic pattern is formed to define exposure areas corresponding to surfaces 92–95 in FIG. 9A. The third lithographic pattern is formed with the following steps:

(a) spin HMDS at 5 krpm for 60 s;
  (b) spin AZ 2400 at 5 krpm for 60 s;
  (c) bake at 90° C. for 20 minutes;
  (d) align and expose mask with ST mode on Karl Suss 300 mask aligner for 30 s; and
  (e) develop mask in 4:1 solution of $H_2O/AZ$ 2401 for 30 s.

The Ti/Au is then deposited on the patterned wafer in accordance with the following steps:

(a) etch SiN in $SF_6$ plasma for 25 s;
  (b) etch in oxygen plasma for 60 minutes;
  (c) deposit 50 nm of Ti and 500 nm of Au on the top surface, and preferably tilting around the ridge line 45° either way alternately to improve step coverage;
  (d) lift off in acetone by boiling and spraying; and
  (e) etch in $SF_6$ plasma for 4 minutes.

The fabrication process proceeds next with formation of the vertical facet surfaces.

As preparation for defining the individual RFM and laser device structures in the ridge waveguide region, a third $SiN_x$ layer is deposited on the wafer. In particular, the Plasma Tech. PECVD machine process 2 step 5 timer is set to 32 minutes, and a 400 nm-thick layer of $SiN_x$ is deposited. A fourth lithographic pattern is then formed to define exposure areas corresponding to regions of facet formation in the wafer. The pattern is formed with the following steps:

(a) spin HMDS at 5 krpm for 60 s;
  (b) spin AZ4400 at 5 krpm for 60 s;
  (c) bake mask at 90° C. for 60 minutes;
  (d) expose mask on Karl Suss mask aligner for 15 s; and
  (e) develop mask in 3:1 solution of $H_2O/AZ$ 400K for 90 s.

The $SiN_x$ layer is then patterned using the above mask, and then etched in an $SF_6$ plasma for 3 minutes to expose regions of the wafer corresponding to desired areas of facet formation. A dry RIE etching step followed by a wet chemical etch step are used to etch through the active layer to a depth of 4 μm and yield smooth vertical facet surfaces. The dry etch involves etching in oxygen plasma for 5 minutes, and reactive ion etching in a $CH_4/H_2/Ar$ plasma at 300Å/min. until a depth of 4 μm is reached. The wet etch uses an 8:1 mixture of $H_3PO_4/HCl$ for 30 s to straighten the face walls.

As shown in the perspective view of FIG. 9A, the facet formation during the RIE etching stop provides channels separating the laser and RFM, and separating the laser and V-groove area. The RIE etching step also removes a portion of the wafer above the substrate that is adjacent to and bordering the ridge-waveguide and fourth layer. Of $SiN_x$ is deposited on the wafer. The Plasma V-groove areas.

The final processing step involves the formation of a fiber-receiving channel in the wafer. In particular, a V-groove geometry is etched into the region of the wafer which is forward the lasing region.

As preparation for forming the V-groove in the wafer, a fourth layer 91 of $SiN_x$ is deposited on the wafer. The Plasma Tech. PECVD machine process 2 step 5 timer is set to 32 minutes, and a 400 run-thick layer of SiN is deposited. A fifth lithographic pattern is then formed to define an exposure area corresponding to the desired V-groove area. In particular, the mask pattern protects the laser/RFM structure while exposing the V-groove area during a subsequent deep etching step (detailed below). The pattern is formed with the following steps:

(a) spinning HMDS at 5 krpm for 60 s;
  (b) spinning AZ4400 at 5 krpm for 60 s;
  (c) baking at 90° C. for 60 minutes;
  (d) exposing mask on Karl Suss 400 mask aligner for 15 s; and
  (e) developing mask in 3:1 solution of $H_2O/AZ$ 400 k for 90 s.

Figure 9B:
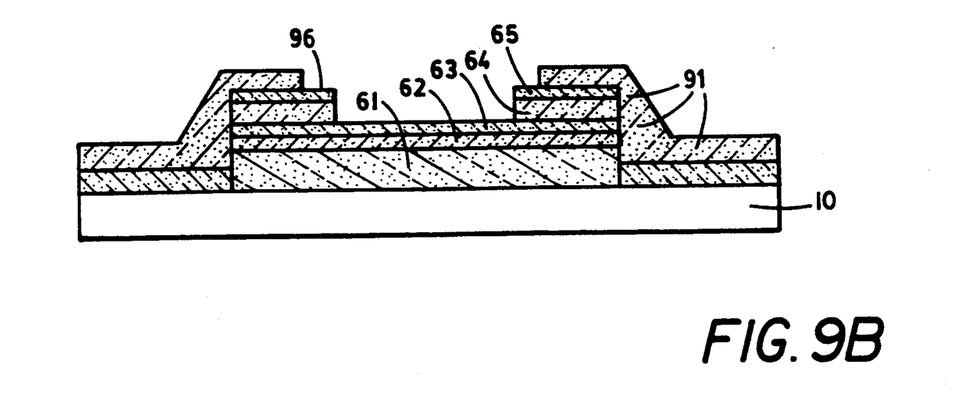

The wafer is then patterned with the mask, and the $SiN_x$ layer 91 is etched in an $SF_6$ plasma for 4 minutes to expose the underlying etch stop layer 63 in the V-groove area. A portion 96 of the contact layer 65 is also exposed. FIG. 9B shows a front cross-sectional view of the V-groove area following the patterned etching of $SiN_x$ layer 97.

Figure 10A:
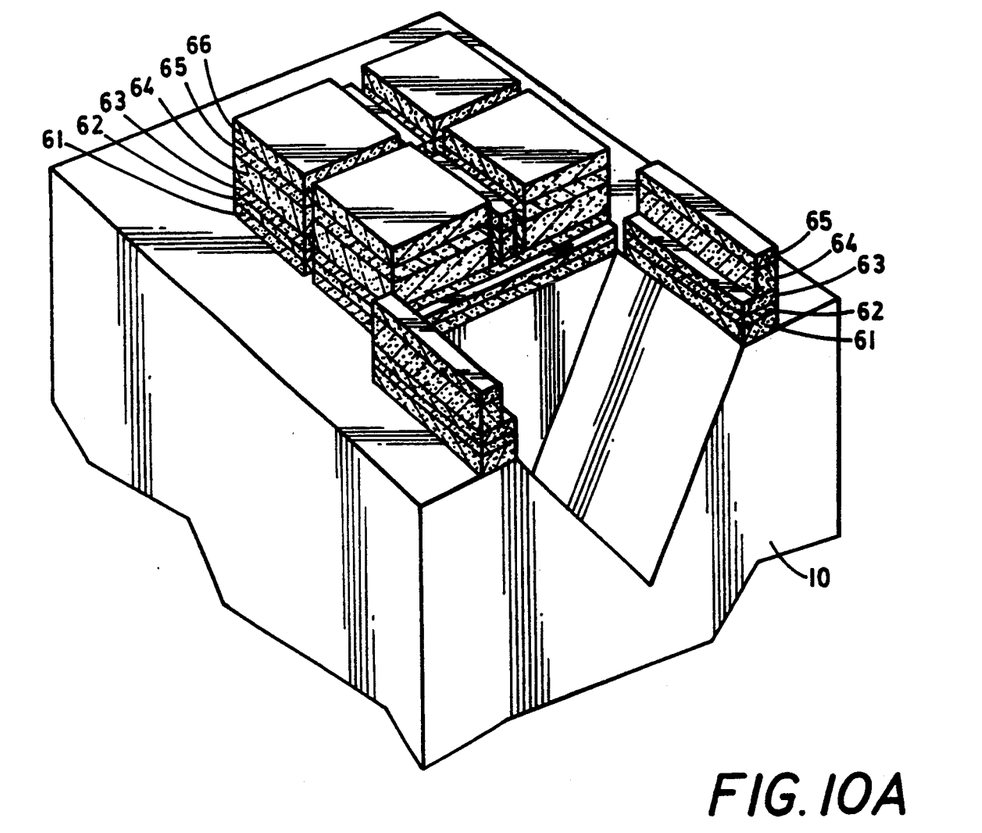
Figure 10B:
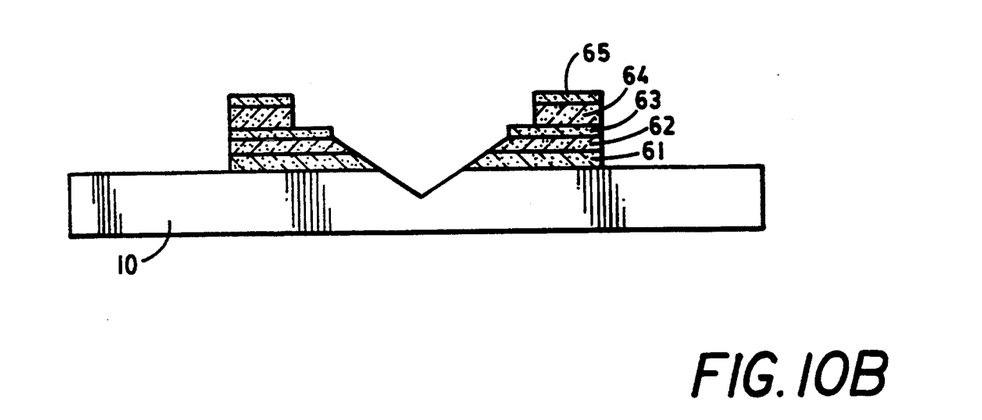

The V-groove geometry is defined by a dry reactive ion etching (RIE) step followed by a wet chemical etch. In particular, the dry etch involves etching in oxygen plasma for 5 minutes, and etching in a $CH_4/Ar/H_2$ plasma for 30 minutes. The wet etch uses a 1:1 mixture of $HCl/CH_3COOH$ for 15 minutes, and is followed by etching of the remaining SiN layer in $SF_6$ plasma for 4 minutes. The etching steps reveal the (112)A crystal plane at an angle of 35° with respect to the (100) wafer surface. A perspective and front cross-sectional view of the final structure are shown in FIGS. 10A and 10B, respectively. As shown, a step-like border is produced on the edges of the V-groove by etching down to the etch stop layer.

The V-groove has a depth of 44.7 µm. The end of the groove is the vertical (110) plane, which serves as a mechanical stop to ensure accurate and reproducible spacing between the laser facet and the end of the fiber. The vertical plane of the groove also protects the laser facet from mechanical damage during the fiber insertion process.

The fabricated structure includes a 3 µm-wide ridge waveguide for both the laser and RFM structures, which are separated by a 5 µm-wide channel. The laser cavity length was 300 µm, and the length of the RFM section was 150 µm. The width and depth of the V-groove was controllably etched so that the core of an optical fiber inserted in the V-groove was aligned to the active region of the laser. Preferably, the fabrication process includes formation of an SnAu n-ohmic contact metallization on the substrate. This back metallization is accomplished by depositing 10 nm of Sn, 30 nm of Au, 50 nm of Ti, and 200 nm of Au on the back of the wafer, and then alloying the metal deposits.

Although the processing steps detailed above and shown in the Figures concern the formation of a single RFM/laser/V-groove structure, it should be obvious to those skilled in the art that a plurality of such structures may be fabricated on a single wafer using the appropriate lithographic mask patterns. A wafer with a plurality of fabricated RFM/laser/V-groove device structures may then be sawed into individual bars each having an array of such device structures, as shown in FIG. 2 for example.

While there has been shown and described what are at present considered the preferred embodiments of the invention, it will be obvious to those skilled in the art that various changes and modifications can be made therein without departing from the scope of the invention as defined by the appended claims.

We claim:

1. A monolithically integrated semiconductor structure, comprising:
   a fiber-receiving channel;
   an optical detection region; and
   a lasing region interposed between and in optical communication with said fiber-receiving channel and said optical detection region.

2. The monolithically integrated semiconductor structure as recited in claim 1 further comprising:
   a V-groove within said fiber-receiving channel;
   an optical fiber positionable within said V-groove; and
   a rear facet monitor structure within said detection region.

3. The semiconductor structure as recited in claim 1 wherein:
   said optical detection region and said lasing region each include a ridge waveguide structure.

4. The semiconductor structure as recited in claim 1 further comprising:
   an InP substrate;
   a first InP cladding layer;
   an InGaAsP active layer;
   an InGaAsP etch stop layer;
   a second InP cladding layer; and
   an InGaAs ohmic contact layer.

5. A monolithically integrated wafer assembly, comprising:
   a plurality of fiber-receiving channels;
   a plurality of optical detection regions each associated with a respective fiber-receiving channel; and
   a plurality of lasing regions each interposed between and in optical communication with a respective fiber-receiving channel and its associated optical detection region.

6. The monolithically integrated wafer assembly as recited in claim 5 further comprising:
   a V-groove within each of said fiber-receiving channels; and
   a rear facet monitor structure within each of said detection regions.

7. The monolithically integrated wafer assembly as recited in claim 5 wherein each of said optical detection regions and lasing regions comprises:
   a ridge waveguide structure.

8. A monolithically integrated optical assembly, comprising:
   a plurality of light detection means;
   a plurality of channels each associated with a respective light detection means and including a V-groove; and
   a plurality of light generating means each interposed between and optically accessible to a respective light detection means and a respective light-guiding means positionable within the channel associated with said light detection means.

9. The monolithically integrated optical assembly as recited in claim 8 wherein:
   each of said light detection means includes a rear facet monitor photodetector; and
   each of said light generating means includes a laser.

* * * * *